US006791175B2

(12) United States Patent
Matsuo et al.

(10) Patent No.: US 6,791,175 B2
(45) Date of Patent: Sep. 14, 2004

(54) STACKED TYPE SEMICONDUCTOR DEVICE

(75) Inventors: Mie Matsuo, Kamakura (JP); Kenichi Imamiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/255,960

(22) Filed: Sep. 27, 2002

(65) Prior Publication Data

US 2003/0062612 A1 Apr. 3, 2003

(30) Foreign Application Priority Data

Sep. 29, 2001 (JP) ........................................ 2001-375022

(51) Int. Cl.[7] .............................................. H01L 23/02
(52) U.S. Cl. ......................... 257/686; 257/686; 257/698
(58) Field of Search ................................ 257/686, 679, 257/737, 723, 777, 673; 710/104; 365/103

(56) References Cited

U.S. PATENT DOCUMENTS

| | | | | |
|---|---|---|---|---|
| 5,581,498 A | * | 12/1996 | Ludwig et al. | ............... 365/63 |
| 5,640,107 A | * | 6/1997 | Kruse | ........................... 326/38 |
| 5,928,343 A | | 7/1999 | Farmwald et al. | |
| 6,239,495 B1 | | 5/2001 | Sakui et al. | |

FOREIGN PATENT DOCUMENTS

| | | |
|---|---|---|
| JP | 7-283375 | 10/1995 |
| JP | 10-97463 | 4/1998 |
| JP | 2001-273755 | 10/2001 |

OTHER PUBLICATIONS

Imamiya et al.; "Semiconductor Memory Device", U.S. patent application Ser. No. 09/956,937, filed Sep. 21, 2001.

Hosono et al.; "Non–volatile Semiconductor Memory", U.S. patent application Ser. No. 09/731,910, filed Dec. 8, 2000.

Nakamura et al.; "Semiconductor Memory Device Having a Plurality of Chips and Capability of Outputting a Busy Signal", U.S. patent application Ser. No. 10/185,645 filed Jun. 28, 2002.

Sasaki; "Multichip Semiconductor Device and Memory Card", U.S. patent application Ser. No. 09/837,262, filed Apr. 19, 2001.

Oyama et al.; "Laminated–Chip Semiconductor Device", U.S. patent application Ser. No. 10/156,819 filed May 30, 2002.

Hayasaka et al.; "Multichip Semiconductor Device, Chip Therefor and Method Of Formation Thereof", U.S. patent application Ser. No. 09/377,486, filed Aug. 20, 1999.

* cited by examiner

Primary Examiner—David Nelms
Assistant Examiner—Thninh T Nguyen
(74) Attorney, Agent, or Firm—Finnegan, Henderson, Farabow, Garrett & Dunner, L.L.P.

(57) ABSTRACT

Disclosed is a stacked type semiconductor device having a plurality of semiconductor integrated circuit chips stacked, each of the semiconductor integrated circuit chips comprising a holding circuit holding identification information about the chip, electrically written in the chip, an identification information setting circuit setting the identification information about the chip, in the holding circuit after the plurality of semiconductor integrated circuit chips have been stacked, and at least one setting terminal used to set the identification information about the chip, in the holding circuit, wherein the at least one setting terminal of any semiconductor integrated circuit chip is connected to the at least one corresponding setting terminal of any other semiconductor integrated circuit chip.

18 Claims, 6 Drawing Sheets

STACKED TYPE SEMICONDUCTOR DEVICE

CROSS-REFERENCE TO RELATED APPLICATIONS

This application is based upon and claims the benefit of priority from the prior Japanese Patent Application No. 2001-375022, filed Sep. 29, 2001, the entire contents of which are incorporated herein by reference.

BACKGROUND OF THE INVENTION

1. Field of the Invention

The present invention relates to a stacked type semiconductor device.

2. Description of the Related Art

In response to an increase in storage capacity required for memory cards and the like, stacked type semiconductor devices (multichip devices) have been proposed which have semiconductor integrated circuit chips (LSI chips) stacked together. The stacked type semiconductor device has a plurality of chips stacked in a vertical direction. Accordingly, this device may be smaller in size (area) than that having chips arranged in a horizontal direction.

In the stacked type semiconductor device, the chips are electrically connected together via, for example, through plugs that penetrate the chips. Thus, to select a desired one of the stacked memory chips of the same structure, the chips must have chip enable bar (/CE) terminals arranged at different positions and which are used to activate (enable) the chip. This prevents the chips from having a common structure, thereby increasing manufacture costs.

To solve this problem, a method has been proposed wherein the chip enable bar terminals for chip selection or terminals to which chip address signals are input are arranged at the same positions of the chips by varying arrangement patterns of bumps used to connect the through plugs in the chips (U.S. Pat. No. 6,239,495). This proposal will be described with reference to FIG. 10.

Figure 10:
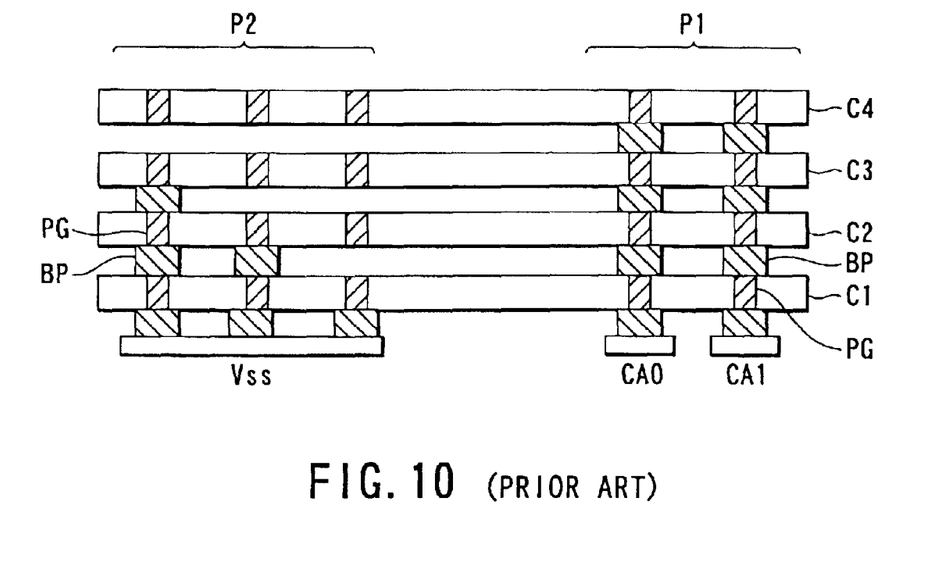
FIG. 10 is a diagram showing an example of a stacked type semiconductor device according to the prior art.

Chips C1 to C4 are provided with through plugs PG connected together by bumps BP. In the figure, P1 denotes a terminal part to which chip address signals (CA0, CA1) used to select (activate) the desired chip are supplied. P2 denotes a part in which terminals used to specify a chip are formed and in which the bumps BP are arranged in a pattern varying among the chips C1 to C4. That is, in the chip C1, all three through plugs PG are connected to a ground potential (Vss). In the chip C2, two through plugs PG are connected to the ground potential (Vss). In the chip C3, one through plug PG is connected to the ground potential (Vss). In the chip C4, no through plugs PG are connected to the ground potential (Vss).

In this manner, the terminals for the chip address signals CA0, CA1 can be arranged at the same positions of the chips by varying the arrangement of the bumps BP and thus the connective relationship among the chips C1 to C4. Then, the desired chip can be selected using the chip address signals (CA0, CA1), by providing each of the chips C1 to C4 with a logic circuit that receives logic values from the terminals (through plugs PG) arranged in the areas denoted by P1 and P2.

However, the above described conventional technique allows the use of chips of the same structure but requires that the arrangement pattern of the bumps is varied among the chips. This hinders a common manufacture process from being appropriately used, thereby increasing manufacture costs. Further, the number of chip specifying terminals arranged in the area denoted by P2 in FIG. 10 increases consistently with the number of chips stacked together.

As described above, the conventional stacked type semiconductor device allows an arbitrary chip to be selected by varying the arrangement pattern of the bumps. This hinders a common manufacturing process from being appropriately used, thereby increasing manufacture costs. Further, the number of chip specifying terminals increases with the number of chips stacked together. Accordingly, it is desirable to provide a stacked type semiconductor device that can prevent an increase in manufacture costs or number of terminals.

BRIEF SUMMARY OF THE INVENTION

According to a first aspect of the present invention, there is provided a stacked type semiconductor device having a plurality of semiconductor integrated circuit chips stacked, each of the semiconductor integrated circuit chips comprising: a holding circuit holding identification information about the chip, electrically written in the chip, an identification information setting circuit setting the identification information about the chip, in the holding circuit after the plurality of semiconductor integrated circuit chips have been stacked, and at least one setting terminal used to set the identification information about the chip, in the holding circuit, wherein the at least one setting terminal of any semiconductor integrated circuit chip is coupled to the at least one corresponding setting terminal of any other semiconductor integrated circuit chip.

According to a second aspect of the present invention, there is provided a stacked type semiconductor device having a plurality of semiconductor integrated circuit chips stacked, each of the semiconductor integrated circuit chips comprising: a holding circuit configured to hold identification information about the chip, to be electrically written in the chip, an identification information setting circuit configured to set the identification information about the chip, in the holding circuit after the plurality of semiconductor integrated circuit chips have been stacked, and at least one setting terminal used to set the identification information about the chip, in the holding circuit, wherein the at least one setting terminal of any semiconductor integrated circuit chip is coupled to the at least one corresponding setting terminal of any other semiconductor integrated circuit chip.

According to a third aspect of the present invention, there is provided a method of manufacturing a stacked type semiconductor device, comprising: preparing a plurality of semiconductor integrated circuit chips, each comprising a holding circuit, electrically writing identification information items about the chips into the holding circuits of the semiconductor integrated circuit chips, stacking the semiconductor integrated circuit chips after writing the identification information items.

DETAILED DESCRIPTION OF THE INVENTION

An embodiment of the present invention will be described below with reference to the drawings.

Figure 1:
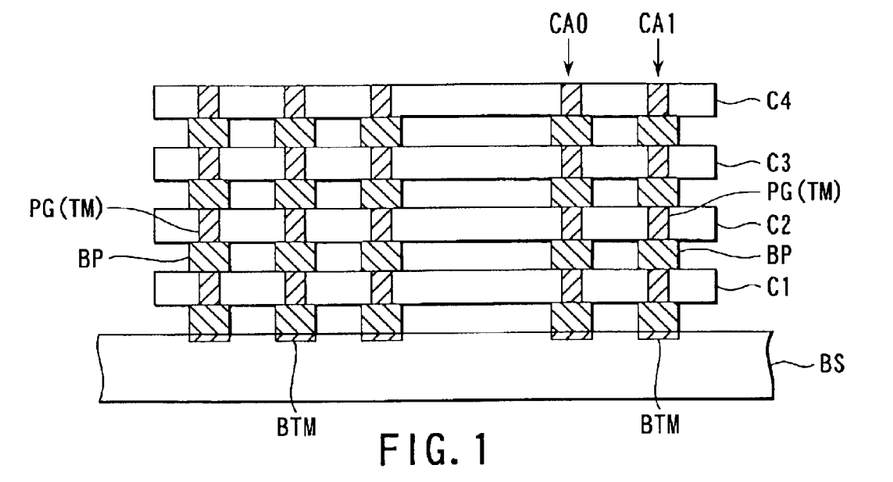
FIG. 1 is a diagram showing an example of a configuration of a stacked type semiconductor device according to an embodiment of the present invention.

FIG. 1 shows an example of a configuration of a stacked type semiconductor device according to this embodiment.

A base substrate BS has a plurality of semiconductor integrated circuit chips (LSI chips) C1 to C4 stacked together thereon. The base substrate functions as a motherboard and is provided with terminals BTM as well as a wiring pattern, power supply, and the like (not shown).

The semiconductor integrated circuits C1 to C4 have substantially the same structure and conform to the same specification. That is, the chips C1 to C4 have substantially the same shape, substantially the same number of terminals, substantially the same circuit configuration, and the like. The expression "substantially the same" is used because for example, redundancy may hinder the chips from having exactly the same circuit configuration or the like. In the chips C1 to C4, at least corresponding terminals to which a clock signal and various control signals are input are connected together.

In this example, terminals TM comprise through plugs PG formed of conductive material and penetrating the chip. The corresponding terminals of the chips are connected together by bumps BP. The terminals TM of each chip include a power terminal and terminals to and from which control and data signals are input and output. A setting terminal is also included which is used to set identification information in a holding circuit as described later. The corresponding setting terminals of the semiconductor integrated circuit chips are connected together. Further, as a select terminal used for chip selection to activate (enable) a desired chip, a terminal is included which specifies a chip address (CA0, CA1). The corresponding select terminals of the semiconductor integrated circuit chips are connected together.

Since the corresponding terminals of the chips C1 to C4 are connected together, the desired chip cannot be selected by simply specifying the chip address CA0 and CA1. Thus, each chip has a holding circuit (not shown) that electrically holds (stores) identification data used to distinguish this chip from the others. The holding circuit includes a semiconductor active element and is structured so that information to be held can be electrically written therein. The holding circuit includes, for example, a non-volatile memory cell. In this example, the four chips C1 to C4 are stacked, so that the identification data can be expressed by 2-bit codes. For example, different codes such as (0, 0), (0, 1), (1, 0), and (1, 1) are assigned to the chips.

Figure 2:
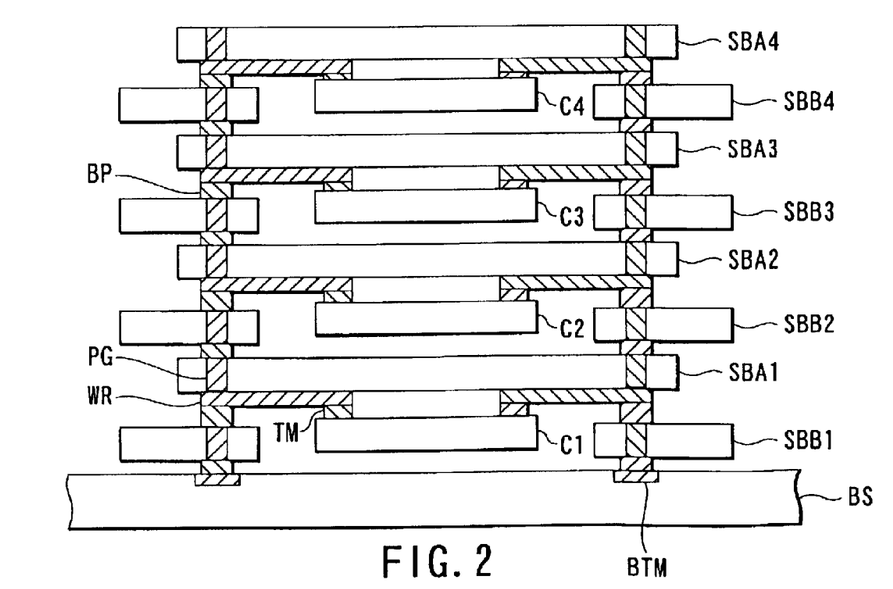
FIG. 2 is a diagram showing another example of a configuration of the stacked type semiconductor device according to the embodiment of the present invention.

FIG. 2 shows another example of a configuration of the stacked type semiconductor device according to this embodiment. The basic concept of this example is similar to that of the example shown in FIG. 1. Here, arrangements different from those of FIG. 1 will be mainly described.

In this example, the semiconductor integrated circuit chips C1 to C4 are mounted on substrates SBA1 to SBA4. Each of the substrates SBA1 to SBA4 has wires WR that electrically connect the terminals TM and the corresponding through plugs PG, described later. Substrates SBB1 to SBB4 are each interposed between the substrates SBA1 to SBA4. The chips C1 to C4 are arranged so as to correspond to holes (device holes) formed in the center portion of the substrates SBB1 to SBB4, respectively. The substrates SBA1 to SBA4 and SBB1 to SBB4 are each provided with the through plug PG, which penetrates that substrate. The through plugs PG are connected together by the bumps BP.

In the following description, the semiconductor integrated circuit chips C1 to C4 are assumed to be non-volatile memory chips such as NAND type $E^2$PROMs. The holding circuit holding the chip's own identification data is assumed to comprise a non-volatile memory cell. Further, the stacked semiconductor device is assumed to be the example of the configuration shown in FIG. 1.

Figure 3:
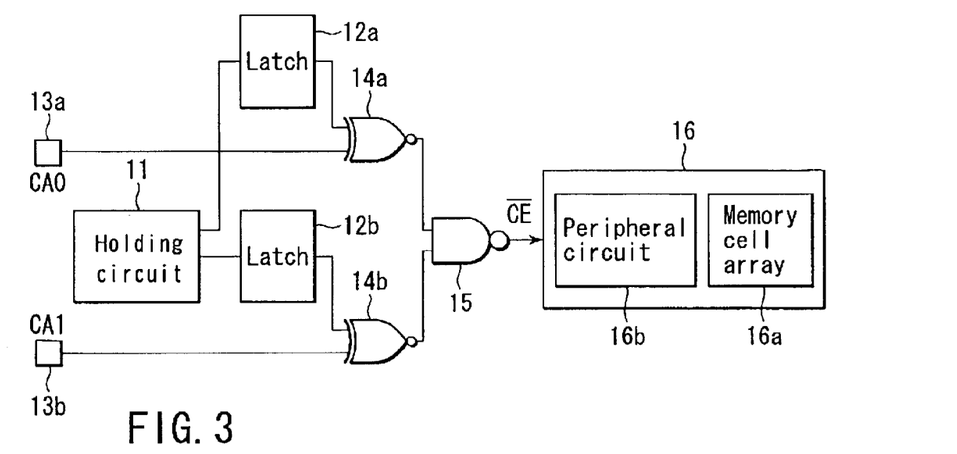
FIG. 3 is a diagram showing an example of a circuit provided in a semiconductor integrated circuit chip according to the embodiment of the present invention.

FIG. 3 shows an example of a circuit provided in each of the semiconductor integrated circuit chips C1 to C4.

A holding circuit 11 in each of the chips C1 to C4 holds the chip's own identification data. For example, the chip C1 holds (0, 0), the chip C2 holds (0, 1), the chip C3 holds (1, 0), and the chip C4 holds (1, 1). When the device is powered on, the lower bit of the identification data held in the holding circuit 11 is latched by a latch circuit 12a. The higher bit is latched by a latch circuit 12b.

The chips C1 to C4 are each provided with terminals 13a and 13b (two of the terminals TM shown in FIG. 1) to which a chip address is input. The terminal 13a receives a lower bit CA0 of a chip address. The terminal 13b receives a higher bit CA1 of the chip address. For example, if the chip C1 is to be selected, the chip address (CA0, CA1) is set to (0, 0). Furthermore, provision of a terminal to which a further higher address bit is input enables setting of the state in which none of the chips C1 to C4 are selected.

An output from the latch circuit 12a and the terminal 13a are connected to an exclusive NOR (EXNOR) circuit 14a. An output from the latch circuit 12b and the terminal 13b are connected to an exclusive NOR (EXNOR) circuit 14b. Outputs from the exclusive NOR circuits 14a and 14b are input to a NAND circuit 15. Accordingly, if the chip address bit CA0 and the latch circuit 12a contain equal data and the chip address bit CA1 and the latch circuit 12b contain equal data, i.e. all chip address bits input by the terminals 13a and 13b equal the identification data held in the holding circuit 11, then an output chip enable bar (/CE) of the NAND circuit 15 is at a low level (logical value of 0). A /CE signal is supplied to a main circuit 16 (for example, in the case of a non-volatile memory chip, a circuit including a memory cell array 16a, a peripheral circuit 16b such as a row decoder and a column decoder, and the like). Only the chip for which the /CE signal becomes active (low level) is activated.

As described above, the stacked type semiconductor device according to this embodiment comprises the holding circuit, which electrically holds the chip's own identification data electrically written in each of the chips. This eliminates the need to vary the connection relationships among the chips for selecting the chip as in the prior art. Consequently, it is unnecessary to vary the arrangement pattern of the bumps among the chips. This allows the use of not only a common chip manufacture process but also a common bump manufacture process. Further, it is unnecessary to provide a large number of terminals for chip specification as in the prior art. This enables prevention of a sharp increase in number of terminals resulting from an increase in number of chips stacked together.

Further, the holding circuit can be electrically rewritten, thereby enabling the identification data to be written and then easily changed. For example, if fuses are used in place of the bumps as means for selecting a chip and are melted using a laser to alter the connection patterns in the chips, then the connection patterns can no longer be altered once the fuses have been cut. However, this embodiment allows the data to be rewritten as required.

Furthermore, the electric writing (rewriting) function enable the identification data to be written in the chips after the chips have been stacked together. For example, the identification data can be written each time the device is powered on.

Now, with reference to the flow chart shown in FIG. 4, description will be given of an example of a method of manufacturing a stacked type semiconductor device according to this embodiment. In this example, the identification data are written before the chips are stacked.

First, according to a predetermined manufacture process, a circuit including semiconductor active elements and wires as well as through plugs are formed in a semiconductor wafer. Furthermore, pads are formed on the through plugs (S11). Subsequently, defective chips, if any, are detected by pre-die-sorting. Then, a redundancy step is carried out to identify and remedy defective cells, if any. The redundancy may be carried out by laser fusion or electric switching. During this step, the identification data are written into the holding circuit. A writing method used in this case is similar to a normal one used for non-volatile memory cells. That is, the identification data are written in the holding circuit of each chip by externally supplying the identification data to the corresponding terminal of the chip (S12). A redundancy circuit for remedying the defective cells may have the same structure as the holding circuit, which holds the identification data, i.e. may be a non-volatile memory. In this case, the common write method can be used for both redundancy and write of the identification data. As a result, the process can be effectively simplified.

Subsequently, bumps are formed on the previously formed pads (S13). The bump forming step may be executed before the step S12. Furthermore, a final die-sort and burn-in steps are executed (S14).

Then, the wafer is polished from its back surface or subjected to a similar step so as to have its thickness reduced. The wafer is further diced into chips (S15). Subsequently, the chips are selected (S16) and then stacked and assembled together (S17). In the stacking step, chips with different identification data written therein are stacked. For example, (0, 0) is written in the chip C1, and (0, 1) is written in the chip C2. (1, 0) is written in the chip C3, and (1, 1) is written in the chip C4.

In this example, the identification data may be written in the holding circuit before the chips are stacked. For example, this write process may be executed during the final die-sort step. That is, in the stacked type semiconductor device of this embodiment, the identification data are electrically written in the holding circuit for holding and can thus be written at a desired time before the chips are stacked.

Figure 5:
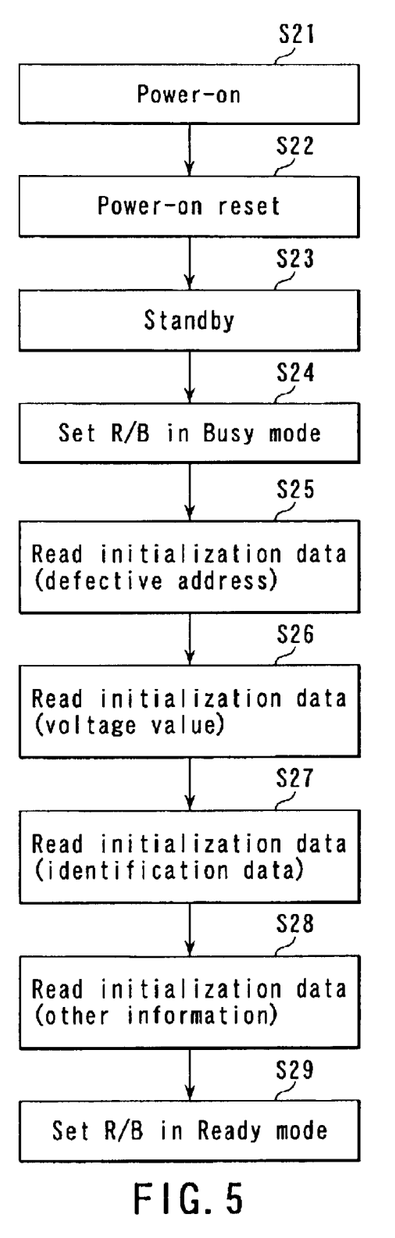
FIG. 5 is a flow chart showing an example of an operation performed by the stacked type semiconductor device after power-on according to the embodiment of the present invention.

Now, with reference to the flow chart shown in FIG. 5, description will be given of an example of an operation performed by the stacked type semiconductor device according to this embodiment (an operation performed after power-on).

When the stacked type semiconductor device is powered on (S21), the chips are powered on and reset (S22). After a predetermined period of a standby state (S23), an R/B (ready/busy) signal terminal of each chip is set to a B (busy) state (S24). Subsequently, an initial setting data read step of reading and setting defective address data is executed (S25). An initial setting data read step of reading and setting control voltage value data is then executed (S26). An initial setting data read step of reading and setting the identification data held in the holding circuit is then executed (S27). Furthermore, an initial setting data read step of reading and setting other data is executed (S28). The processing in step S27 corresponds to an operation performed by the latch circuits 12a and 12b to latch the identification data held in the holding circuit 11. Subsequently, the R/B signal terminal is set in an R (Ready) state, i.e. a standby state in which the terminal is externally accessible (S29).

After the initialization described above, the chip address signals CA0 and CA1 can be externally input to the terminals 13a and 13b, respectively, to select the desired one of the chips C1 to C4, as shown in FIG. 3.

Next, with reference to the flow chart shown in FIG. 6, description will be given of another example of the method of manufacturing a stacked type semiconductor device according to this embodiment.

Figure 4:
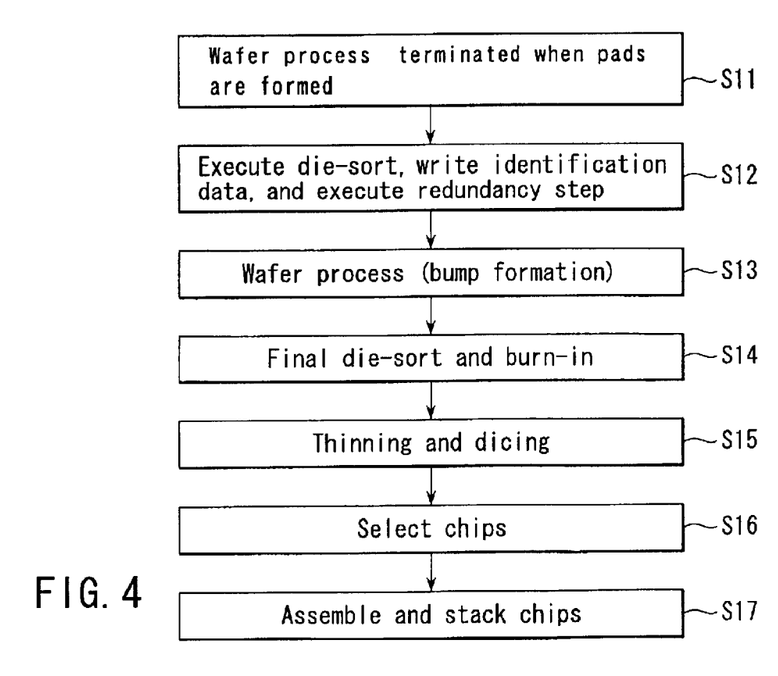
FIG. 4 is a flow chart showing an example of a method of manufacturing a stacked type semiconductor device according to the embodiment of the present invention.
Figure 6:
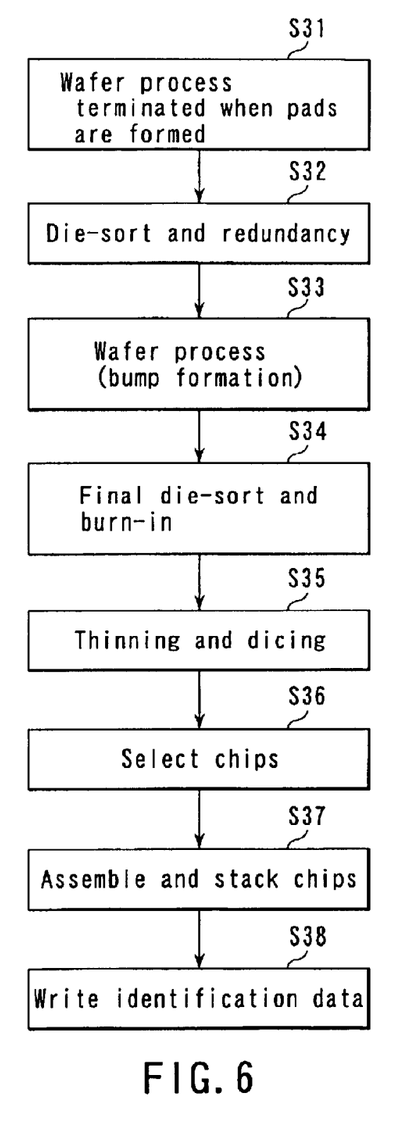
FIG. 6 is a flow chart showing another example of the method of manufacturing a stacked type semiconductor device according to the embodiment of the present invention.

As is apparent from comparison of the flow chart shown in FIG. 6 with the flow chart shown in FIG. 4, in this example, an operation of writing the identification data is not performed at step S32. Instead, after the chips C1 to C4 have been stacked together, the identification data are written in the holding circuit at step S38. That is, the identification data are written in the holding circuit after all chips C1 to C4 have been stacked together. The other basic processing (S31, S33 to S37) is similar to that in the example shown in FIG. 4.

In this manner, the stacked type semiconductor device according to this embodiment comprises the holding circuit, which holds the chip's own identification data electrically written in each of the chips. Accordingly, the identification data can be written in the holding circuit after the chips have been stacked. Description will be given below of a specific example of a process of writing the identification data after the chips have been stacked.

Figure 7:
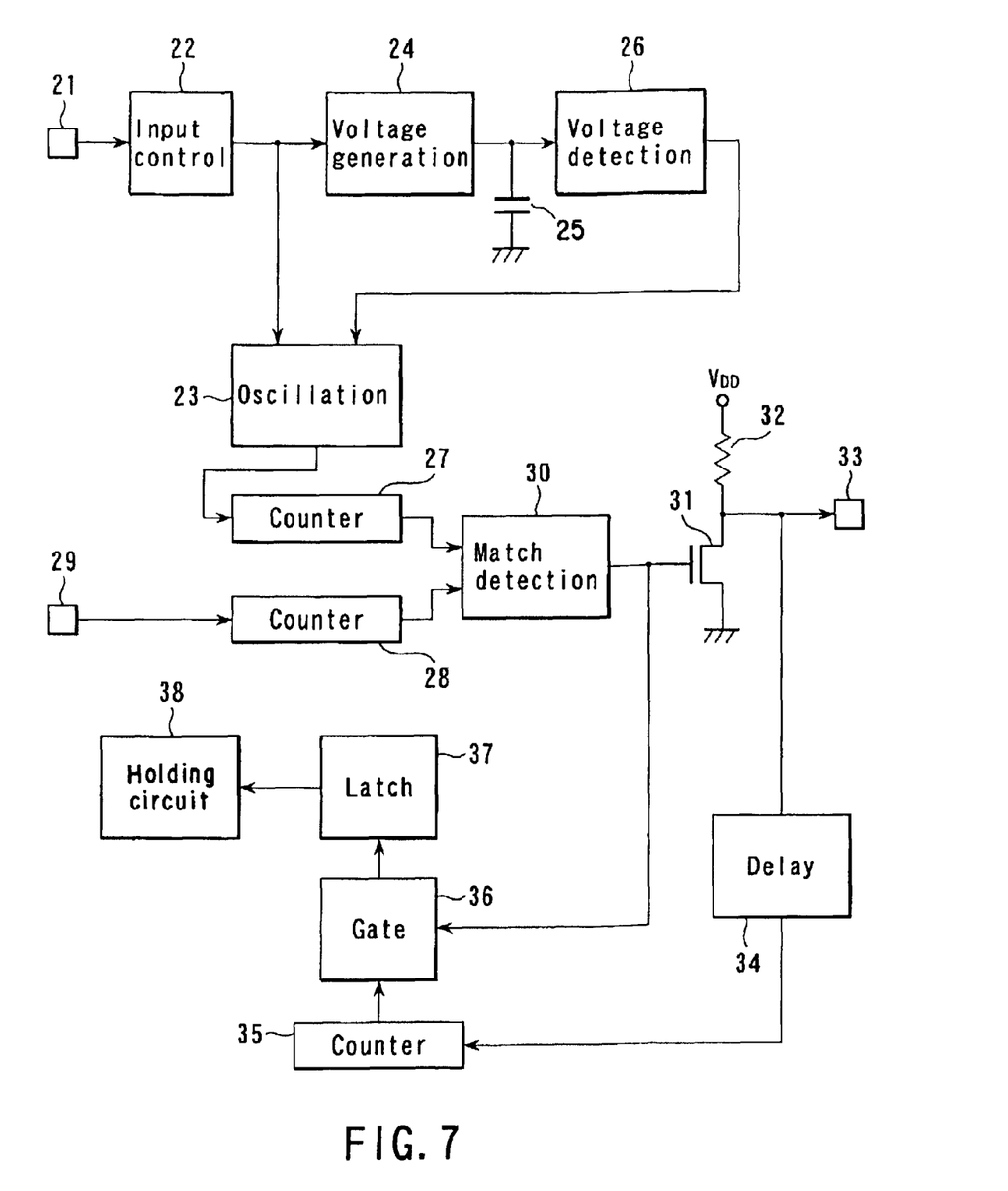
FIG. 7 is a block diagram showing an example of a configuration of an identification information setting circuit provided in the semiconductor integrated circuit chip according to the embodiment of the present invention.

FIG. 7 is a block diagram showing an example of a configuration of an identification information setting circuit that executes the above process. A circuit such as the one shown in FIG. 7 is formed in each of the chips C1 to C4 so as to have the same configuration. Further, terminals (21, 29, 33), described later, are also formed in each of the chips C1 to C4 so as to have the same configurations. The corresponding terminals (21, 29, or 33) of the chips C1 to C4 are connected together.

The terminal 21 has an input control circuit 22 connected thereto. For example, a control signal externally input to the terminal 21 causes an oscillation start signal from the input control circuit 22 to be transmitted to an oscillation circuit 23. The input control circuit 22 has a voltage generating circuit 24 connected thereto. The voltage generating circuit 24 receives a signal from the input control circuit 22 to generate a predetermined voltage. The voltage generated by the voltage generating circuit 24 is gradually charged into a capacitor (a parasitic capacitance in the chip) 25. The voltage charged into the capacitor 25 increases gradually over time. The voltage charged into the capacitor 25 is detected by a voltage detecting circuit 26. When the charged voltage reaches a predetermined value, the voltage detecting circuit 26 transmits an oscillation end signal to the oscillation circuit 23 to stop oscillating the oscillation circuit 23.

The oscillation circuit 23 has a counter circuit 27 connected thereto. The counter circuit 27 counts oscillation signals from the oscillation circuit 23 as clock signals. That is, the counter circuit 27 counts the time elapsing after the above mentioned oscillation start signal has been generated and before the oscillation end signal is generated. The capacity of the capacitor 25 and the oscillation frequency of the oscillation circuit 23 vary among the chips. Accordingly, the count provided by the counter circuit 27 normally varies among the chips C1 to C4.

A counter circuit 28 performs a count operation on the basis of a clock signal externally supplied via the terminal 29. The clock signal is externally input to each of the chips after the count operation performed by the counter circuit 27 has been completed. The counts from the counter circuits 27 and 28 are input to a match detecting circuit 30. The match detecting circuit 30 outputs a match signal when both counts from the counter circuits 27 and 28 become equal. As described previously, the count from the counter circuit 27 varies among the chips C1 to C4, so that a timing with which the match signal is output by the match detecting circuit 30 varies among the chips C1 to C4.

A match signal from the match detecting circuit 30 is output to the terminal 33 via a transistor 31 to which a pull-up resistor 32 is connected. The terminals 33 of the chips C1 to C4 are connected together. Accordingly, a match signal generated in a certain chip is supplied to the other chips. A match signal generated in the chip (an output signal from the transistor 31) and a match signal generated in the other chips (a match signal input via the terminal 33) are input to a counter circuit (in this example, a 2-bit configuration) 35 via a delay circuit 34. Thus, a count in the counter circuit 35 is incremented whenever a match signal is generated in the chips.

A match signal from the match detecting circuit 30 is also input to a gate circuit 36. A match signal generated in the chip makes the gate circuit 36 conductive to cause a count from the counter circuit 35 is latched by the latch circuit 37 via the gate circuit 36. Since the counter circuit 35 has the delay circuit 34 connected to the input thereof, the count present before the match signal is generated is latched by the latch circuit 37. For example, if a match signal is generated firstly in the chip C1, the counter circuit 35 of the chip C1 has a count of "00". This value "00" is latched by the latch circuit 37 of the chip C1. If a match signal is then generated in the chip C2, the counter circuit 35 of the chip C2 has a count of "01". This value "01" is latched by the latch circuit 37 of the chip C2. In this manner, the latch circuits 37 of the chips C1 to C4 latch the different counts "00", "01", "10", and "11", respectively.

The values latched by the latch circuits 37 in the chips C1 to C4 are written in the holding circuits (corresponding to the holding circuit 11 in FIG. 3) in the chips C1 to C4. As a result, the holding circuits 38 in the chips C1 to C4 store the different values, i.e. the different identification data.

Figure 8:
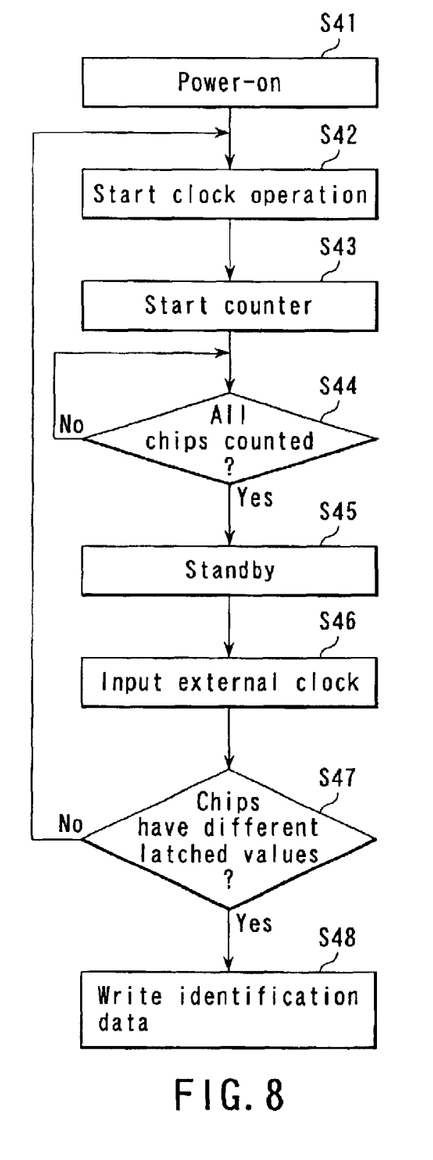
FIG. 8 is a flow chart showing an example of a method of setting identification information according to the embodiment of the present invention.

FIG. 8 is a flow chart showing an example of an operation performed by the circuit shown in FIG. 7.

After power-on (S41), when a control signal is input to the terminal 21 of each chip, an oscillation start signal from the input control circuit 22 causes the oscillation circuit 23 to start an oscillation operation (S42). Further, the counter 27 starts a count operation using an oscillation signal as a clock (S43). When the voltage detecting circuit 26 outputs an oscillation end signal and the count operations performed in the chips C1 to C4 are finished (S44), the chips C1 to C4 are brought into a standby state (S45).

Subsequently, a common external clock signal is supplied to the terminals 29 of the chips and is counted by the counter circuits 28 of the chips (S46). In each chip, the match detecting circuit 30 performs a match detecting operation, the latch circuit 37 latches a count, and other relevant operations are performed, as described previously.

The counts in the counters 27 of the chips C1 to C4 normally vary owing to differences in time required to charge the parasitic capacitance. However, the counts in the counters 27 of two or more chips may happen to be equal. In such a case, match signals are simultaneously generated by the match detecting circuits 30 of the two or more chips. Accordingly, the counts latched by the latch circuits 37 of these chips are equal. Thus, it is determined whether or not the counts latched by the latch circuits 37 vary among the chips (S47). In this example, instead of comparing the counts latched by the latch circuits 37, match signals output by the terminals 33 are counted by an external device. If the latch circuits 37 of two or more chips have an equal count, match signals are simultaneously generated by the terminals 33 of these chips. Thus, the external device has a count of three or less. Accordingly, if the external device has a count of three or less, a control signal is input to the terminals 21 to reset the counters 27, 28, and 35 and perform other relevant operations. Then, a process similar to the one described above is repeated until different counts are latched by the latch circuits 37 of the chips (the external device has a count of four).

If the count latched by the latch circuit 37 varies among the chips (the external device has a count of four), the counts latched by the latch circuits 37 of the chips are written in the corresponding holding circuits 38 as identification data (S48).

The counts in the latch circuits 37 or counters 27 of the chips may be compared with one another, and if two or more chips have an equal count, then the process may be repeated as described above starting with step S42.

As described above, by using the differences between the chips in time required to perform a predetermined operation, such as time required to charge the parasitic capacitance, the different identification information can be written in the holding circuits even after the chips have been stacked.

In the example described in FIGS. 7 and 8, different identification data are stored in the holding circuits in the chips on the basis of differences between the chips in time required to charge the capacitance (parasitic capacitance). However, the embodiment may be based on differences between the chips in time required to perform an arbitrary operation. For example, the embodiment may be based on differences between the chips in time required to write data in the memory cell (in the memory cell array).

Figure 9:
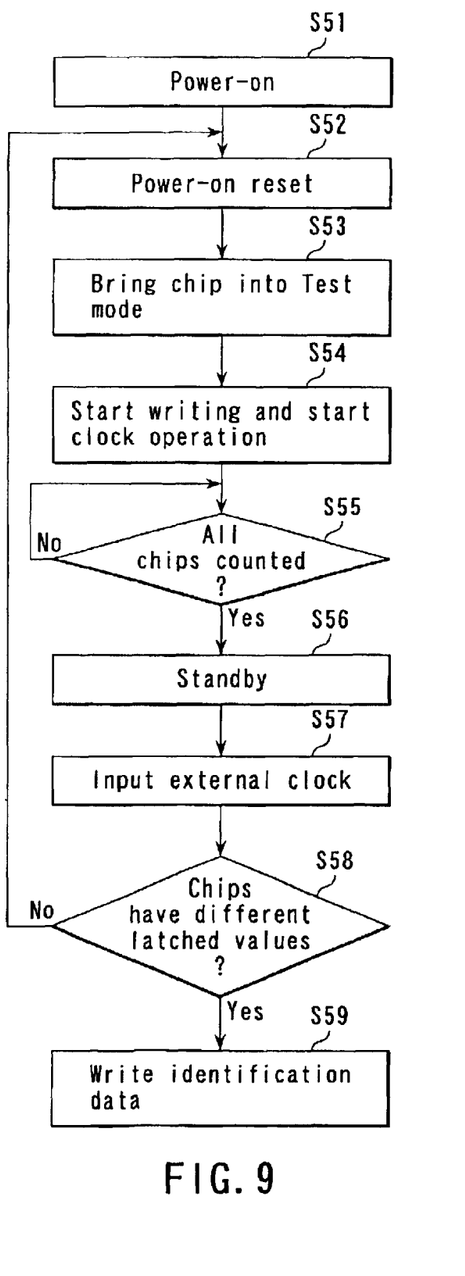
FIG. 9 is a flow chart showing another example of the method of setting identification information according to the embodiment of the present invention.

FIG. 9 is a flow chart showing an operation performed if such a method is used to store the identification data. Although no circuit configurations are shown, this circuit is the same as the one shown in FIG. 7 except for the configurations provided before the input of the counter 27. The counter 27 and the following configurations (denoted by reference numerals 27 to 38) are similar to those in the example in FIG. 7.

After power-on (S51) and power-on reset (S52), each chip is brought into a test mode (S53). Then, an operation of writing to the memory cell is started, and simultaneously with the start of the write, the counter (corresponding to the counter 27 in FIG. 7) starts an operation (S54). When writings have been completed in all chips C1 to C4 and a count operation is finished (S55), the chips C1 to C4 are brought into a standby state (S56). The subsequent basic processing (S57 to S59) is similar to that in the example shown in FIG. 8.

Thus, also in this example, the identification data can be written in the holding circuit after the chips have been stacked as with the example shown in FIG. 8. This example is based on differences in time required to write data in the memory cell. However, the embodiment may be based on differences in time required for erasing or both differences in time required for erasing and differences in time required for writing.

The embodiment of the present invention has been described above. However, the following alterations may be made to this embodiment.

In the above described embodiment, the holding circuit is provided separately from the memory cell array in the main circuit. However, the memory cell in the memory cell array may be used for the holding circuit.

Further, in the above described embodiment, the device is assumed in which the semiconductor integrated circuit chips are formed of non-volatile memory chips and in which the holding circuits are formed of non-volatile memory cells. However, other chip or holding circuit may be used.

For example, if the identification data are written in the holding circuit after the chips have been stacked as described in FIGS. 6 to 9, volatile memory chips such as DRAMs may be used as the semiconductor integrated circuit chips and volatile memory cells for DRAMs may be used as the holding circuits. For example, with DRAM chips, data in the memory cell array are lost upon power-off. Thus, the identification data held in the holding circuit are lost upon power-off. However, no problems occur if the identification data are newly stored in the holding circuit upon power-on. In short, the identification data need not be stored in the holding circuit before power-on but may be stored in the holding circuit whenever the device has been powered on.

Further, the holding circuit need not have an electrically rewritable structure provided that it has an electrically writable structure. For example, the chip's own identification information, which has already been set, may be held without being changed, as in the case with a PROM using an anti-fuse element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stacked type semiconductor device having a plurality of semiconductor integrated circuit chips stacked, each of the semiconductor integrated circuit chips comprising:

a holding circuit holding identification information about the chip, electrically written in the chip;

an identification information setting circuit setting the identification information about the chip, in the holding circuit after the plurality of semiconductor integrated circuit chips have been stacked; and one or more setting terminals used to set the identification information about the chip, in the holding circuit;

wherein said one or more setting terminals of any semiconductor integrated circuit chip are coupled to said one or more corresponding setting terminals of any other semiconductor integrated circuit chip.

2. The stacked type semiconductor device according to claim 1, wherein the semiconductor integrated circuit chips have substantially the same circuit configuration.

3. The stacked type semiconductor device according to claim 1, wherein each of the semiconductor integrated circuit chips further comprises at least one select terminal to which a signal for chip selection is input, and said at least one select terminal of any semiconductor integrated circuit chip is coupled to said at least one corresponding select terminal of any other semiconductor integrated circuit chip.

4. The stacked type semiconductor device according to claim 1, wherein the holding circuit has a structure which allows information to be electrically rewritten.

5. The stacked type semiconductor device according to claim 1, wherein the holding circuit includes a non-volatile memory cell.

6. The stacked type semiconductor device according to claim 1, wherein the identification information setting circuit sets the identification information in the holding circuit on the basis of a difference between the semiconductor integrated circuit chips in time required to perform a predetermined operation.

7. The stacked type semiconductor device according to claim 6, wherein the predetermined operation includes an operation of charging a capacitance in the semiconductor integrated circuit chip.

8. The stacked type semiconductor device according to claim 6, wherein the predetermined operation includes a writing operation or an erasing operation for a memory cell in the semiconductor integrated circuit chip.

9. A stacked type semiconductor device having a plurality of semiconductor integrated circuit chips stacked, each of the semiconductor integrated circuit chips comprising:

a holding circuit configured to hold identification information about the chip, to be electrically written in the chip;

an identification information setting circuit configured to set the identification information about the chip, in the holding circuit after the plurality of semiconductor integrated circuit chips have been stacked; and one or more setting terminals used to set the identification information about the chip in the holding circuit;

wherein said one or more setting terminals of any semiconductor integrated circuit chip are coupled to said one or more corresponding setting terminals of any other semiconductor integrated circuit chip.

10. The stacked type semiconductor device according to claim 9, wherein the semiconductor integrated circuit chips have substantially the same circuit configuration.

11. The stacked type semiconductor device according to claim 9, wherein each of the semiconductor integrated circuit chips further comprises at least one select terminal which a signal for chip selection is input, and said at least one select terminal of any semiconductor integrated circuit chip is coupled to said at least one corresponding select terminal of any other semiconductor integrated circuit chip.

12. The stacked type semiconductor device according to claim 9, wherein the holding circuit has a structure which allows information to be electrically rewritten.

13. The stacked type semiconductor device according to claim 9, wherein the holding circuit includes a non-volatile memory cell or a volatile memory cell.

14. The stacked type semiconductor device according to claim 9, wherein the identification information setting circuit is configured to set the identification information in the holding circuit on the basis of a difference between the semiconductor integrated circuit chips in time required to perform a predetermined operation.

15. The stacked type semiconductor device according to claim 14, wherein the predetermined operation includes an operation of charging a capacitance in the semiconductor integrated circuit chip.

16. The stacked type semiconductor device according to claim 14, wherein the predetermined operation includes a writing operation or an erasing operation for a memory cell in the semiconductor integrated circuit chip.

17. The stacked type semiconductor device according to claim 1, wherein each of the semiconductor integrated circuit chips comprises a plurality of the setting terminals, and wherein said plurality of setting terminals of any semiconductor integrated circuit chip are coupled to corresponding setting terminals of any other semiconductor integrated circuit chip.

18. The stacked type semiconductor device according to claim 9, wherein each of the semiconductor integrated circuit chips comprises a plurality of the setting terminals, and wherein said plurality of setting terminals of any semiconductor integrated circuit chip are coupled to corresponding setting terminals of any other semiconductor integrated circuit chip.

* * * * *